(12) United States Patent
Fujiwara et al.

(10) Patent No.: US 8,384,495 B2
(45) Date of Patent: Feb. 26, 2013

(54) ACOUSTIC WAVE DUPLEXER

(75) Inventors: Joji Fujiwara, Osaka (JP); Tetsuya Tsurunari, Osaka (JP); Hiroyuki Nakamura, Osaka (JP); Rei Goto, Osaka (JP)

(73) Assignee: Panasonic Corporation, Osaka (JP)

( * ) Notice: Subject to any disclaimer, the term of this patent is extended or adjusted under 35 U.S.C. 154(b) by 304 days.

(21) Appl. No.: 12/993,893

(22) PCT Filed: May 14, 2009

(86) PCT No.: PCT/JP2009/002101
§ 371 (c)(1),
(2), (4) Date: Nov. 22, 2010

(87) PCT Pub. No.: WO2009/147787
PCT Pub. Date: Dec. 10, 2009

(65) Prior Publication Data
US 2011/0095845 A1 Apr. 28, 2011

(30) Foreign Application Priority Data
Jun. 6, 2008 (JP) .................. 2008-148781

(51) Int. Cl.
*H03H 9/72* (2006.01)
*H03H 9/64* (2006.01)

(52) U.S. Cl. .................. 333/133; 333/193; 333/195

(58) Field of Classification Search .................. 333/133, 333/193–196; 310/313 B, 313 D
See application file for complete search history.

(56) References Cited

U.S. PATENT DOCUMENTS

| 6,737,941 | B1 | 5/2004 | Tournois | |
|---|---|---|---|---|
| 7,310,027 | B2 * | 12/2007 | Kando | 333/133 |
| 7,456,705 | B2 * | 11/2008 | Ito | 333/133 |
| 2009/0072659 | A1 | 3/2009 | Nishiyama et al. | |

FOREIGN PATENT DOCUMENTS

| JP | 63-260213 A | 10/1988 |
|---|---|---|
| JP | 09-167937 A | 6/1997 |
| JP | 11-112281 A | 4/1999 |
| JP | 2005-295203 A | 10/2005 |
| JP | 2007-142560 A | 6/2007 |
| WO | WO 01/29964 A1 | 4/2001 |
| WO | WO 2007/145056 A1 | 12/2007 |
| WO | PCT/JP2009/002101 | 7/2009 |

* cited by examiner

*Primary Examiner* — Barbara Summons
(74) *Attorney, Agent, or Firm* — RatnerPrestia

(57) ABSTRACT

An acoustic wave duplexer includes a piezoelectric substrate, a first filter and a second filter whose center frequency is higher than that of the first filter, the first and second filters being provided on the piezoelectric substrate. The first filter is structured as a ladder type. A resonator positioned nearest to an antenna terminal out of series-arm resonators is designated as a first resonator. A pitch of a comb-shaped electrode structuring the first resonator is set such that a bulk wave emission frequency of the first resonator becomes higher than a passband of the second filter.

10 Claims, 4 Drawing Sheets

ACOUSTIC WAVE DUPLEXER

This application is a U.S. NATIONAL PHASE APPLICATION OF PCT INTERNATIONAL APPLICATION No. PCT/JP2009/002101.

TECHNICAL FIELD

The present invention relates to an acoustic wave duplexer that is chiefly used in mobile communication equipment.

BACKGROUND ART

As shown in FIG. 5, what is known as a conventional acoustic wave duplexer is a surface acoustic wave duplexer that includes antenna terminal 101, transmission terminal 100, reception terminal 102, and phase circuit 200, in which transmission filter 2 and reception filter 3 are structured as a ladder type on piezoelectric substrate 1, using resonators 4, inductors 5 and the like.

As information on prior art documents related to the present application, Patent Document 1 is known, for example.

Conventionally, such an acoustic wave duplexer has been manufactured employing a rotated Y-cut lithium tantalate as piezoelectric substrate 1.

In recent years, various systems have been coming into use in mobile phones. As to those systems such as WCDMA Band 1 system, in which frequencies are widely separated between the transmission band of 1920 MHz to 1980 MHz and the reception band of 2110 MHz to 2170 MHz, the electromechanical coupling factor is insufficient. Therefore, it has been increasingly difficult to secure an enough attenuation amount of the duplex band and adequate isolation.

PRIOR ART DOCUMENT

[Patent Document]
[Patent Document1]Unexamined Japanese Patent Publication No. 2007-142560

DISCLOSURE OF THE INVENTION

The present invention provides an acoustic wave duplexer with improved attenuation amount and isolation in the acoustic wave duplexer.

The present invention is an acoustic wave duplexer including a piezoelectric substrate, and a first filter and a second filter provided on the piezoelectric substrate. A passband of the first filter is set to be lower than a passband of the second filter. The first filter is structured as a ladder type made up of series-arm resonators and parallel-arm resonators. A resonator positioned nearest to an antenna terminal out of the series-arm resonators is designated as a first resonator. A pitch of a comb-shaped electrode structuring the first resonator is set such that a bulk wave emission frequency of the first resonator becomes higher than the passband of the second filter. The series-arm resonators and the parallel-arm resonators except for the first resonator are designated as second resonators. A pitch of a comb-shaped electrode structuring each of the second resonators is set such that a bulk wave emission frequency of at least one resonator structuring the second resonators becomes lower than the passband of the second filter.

PREFERRED EMBODIMENTS FOR CARRYING OUT OF THE INVENTION

In the following, a description will be given of embodiments of the present invention with reference to the drawings.
(First Embodiment)

Figure 1:
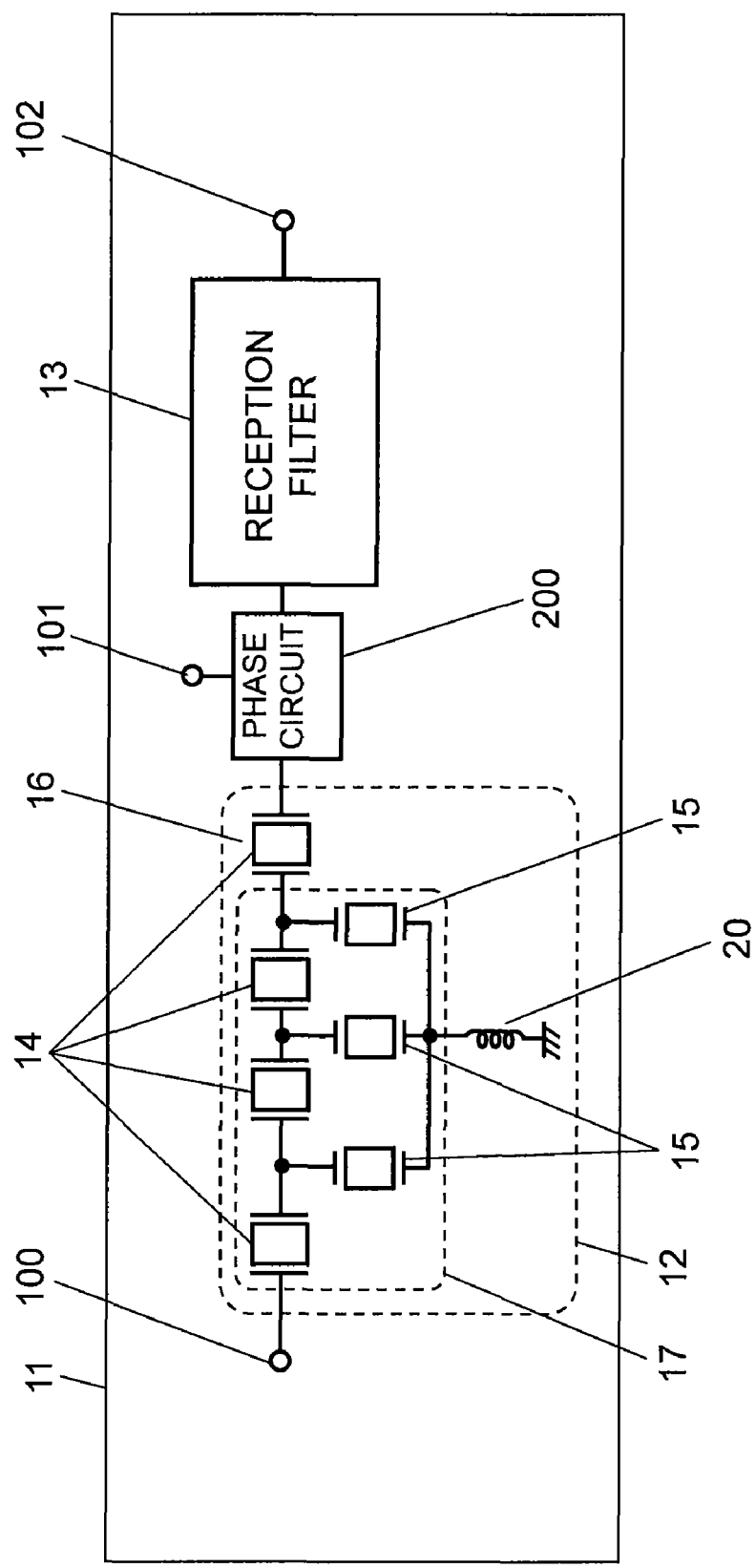
FIG. 1 is a configuration diagram of an acoustic wave duplexer according to a first embodiment of the present invention.
Figure 2:
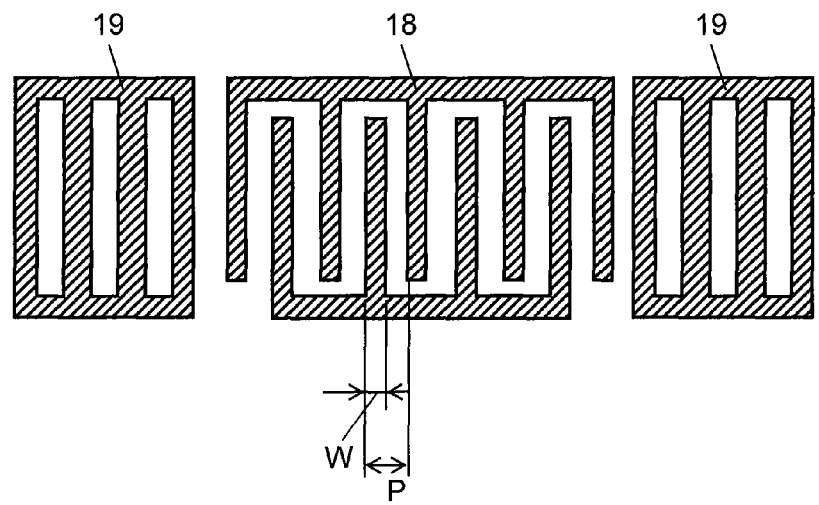
FIG. 2 is an explanatory diagram of the acoustic wave duplexer according to the first embodiment of the present invention.

FIG. 1 is a configuration diagram schematically showing an acoustic wave duplexer for the WCDMA Band 1 system in a first embodiment of the present invention. It is basically structured by disposing a first filter (transmission filter 12) and a second filter (reception filter 13) on piezoelectric substrate 11. Hereinafter, for the sake of simplicity, the first filter (transmission filter 12) is referred to as transmission filter 12, and the second filter (reception filter 13) is referred to as reception filter 13. Transmission filter 12 is structured as the ladder type made up of series-arm resonators 14, parallel-arm resonators 15, and inductor 20. A resonator positioned nearest to antenna terminal 101 out of series-arm resonators 14 is designated as first resonator 16, and series-arm resonators 14 and parallel-arm resonators 15 except for first resonator 16 are designated as second resonators 17. As shown in FIG. 2, the resonators are each a one-port type resonator in which reflective electrodes 19 are respectively disposed on opposite sides of comb-shaped electrode 18. A pitch of comb-shaped electrode 18 is denoted by P, a line width thereof is denoted by W, and W/P is referred to as a duty ratio. In this case, the pitch of comb-shaped electrode 18 of first resonator 16 is 0.9230 μm and the duty ratio thereof is 0.65; and the pitch of comb-shaped electrode 18 of each second resonator 17 is 0.9599 μm and the duty ratio thereof is 0.50. As piezoelectric substrate 11, a 5° Y-cut X-propagating lithium niobate is used. Use of the lithium niobate as piezoelectric substrate 11 makes it possible to increase an electromechanical coupling factor of the resonators formed on piezoelectric substrate 11, which makes it possible to implement a wideband filter. (Table 1) shows representative bands of WCDMA, a transmission frequency band and a reception frequency band corresponding to each band, and a desirable upper limit pitch of comb-shaped electrode 18 of first resonator 16 in the duplexer of each band.

TABLE 1

| BAND | TRANSMISSION FREQUENCY BAND (MHz) | RECEPTION FREQUENCY BAND (MHz) | UPPER LIMIT PITCH OF COMB-SHAPED ELECTRODE OF FIRST RESONATOR 16 |
|---|---|---|---|
| 1 | 1920 to 1980 | 2110 to 2170 | 0.927 |
| 2 | 1850 to 1910 | 1930 to 1990 | 1.011 |
| 3 | 1710 to 1785 | 1805 to 1880 | 1.070 |
| 4 | 1710 to 1755 | 2110 to 2155 | 0.934 |
| 5 | 824 to 849 | 869 to 894 | 2.251 |
| 6 | 830 to 840 | 875 to 885 | 2.273 |
| 7 | 2500 to 2570 | 2620 to 2690 | 0.748 |
| 8 | 880 to 915 | 925 to 960 | 2.096 |
| 9 | 1750 to 1785 | 1845 to 1880 | 1.070 |

TABLE 1-continued

| BAND | TRANSMISSION FREQUENCY BAND (MHz) | RECEPTION FREQUENCY BAND (MHz) | UPPER LIMIT PITCH OF COMB-SHAPED ELECTRODE OF FIRST RESONATOR 16 |
|---|---|---|---|
| 10 | 1710 to 1770 | 2110 to 2170 | 0.927 |
| 11 | 1429 to 1453 | 1477 to 1501 | 1.340 |
| 12 | 698 to 716 | 728 to 746 | 2.697 |
| 13 | 776 to 788 | 746 to 758 | 2.654 |

The surface acoustic wave resonator structured in this manner excites and resonates a surface acoustic wave as to a prescribed frequency, and emits a bulk wave as to a prescribed frequency or higher. The bulk wave emission frequency is represented by Vt/2P, where Vt is a slow transverse wave propagation speed of piezoelectric substrate 11, and P is the pitch shown in FIG. 2. In a case where a substrate such as a rotated Y-cut X-propagating lithium niobate whose slow transverse wave propagation speed is 4024 m/s, which is relatively slow, is used, the bulk wave emission frequency comes close to the anti-resonance frequency of the resonators. This may affect the device characteristics.

Specifically, with a normal filter that is not in the duplexer form, such a closeness of the bulk wave emission frequency near the anti-resonance frequency of the series-arm resonators poses no problem. However, in a case where the bulk wave emission frequency of first resonator 16 of the duplexer shown in FIG. 1 enters the passband of reception filter 13, while the characteristics of transmission filter 12 are not affected, part of a reception signal entered from antenna terminal 101 is converted into a bulk wave by first resonator 16, consuming the energy. As a result, an insertion loss of reception filter 13 becomes greater.

In contrast thereto, in accordance with the present invention, because the bulk wave emission frequency of first resonator 16 is set to be higher than the passband of reception filter 13, an increase in the insertion loss of reception filter 13 can be prevented. However, if the frequency is just simply raised, the resonance frequency of first resonator 16 becomes far higher than the passband of transmission filter 12, which invites an increase in the insertion loss of transmission filter 12. Hence, by taking measures to increase the duty ratio of the comb-shaped electrode, so as to lower the resonance frequency to be near the passband of transmission filter 12, the increase in the insertion loss can be prevented. Because the bulk wave emission frequency is dependent only on the pitch and not on the duty ratio, it becomes possible to obtain desired pass characteristics while shifting the bulk wave emission frequency toward higher range side.

Figure 3:
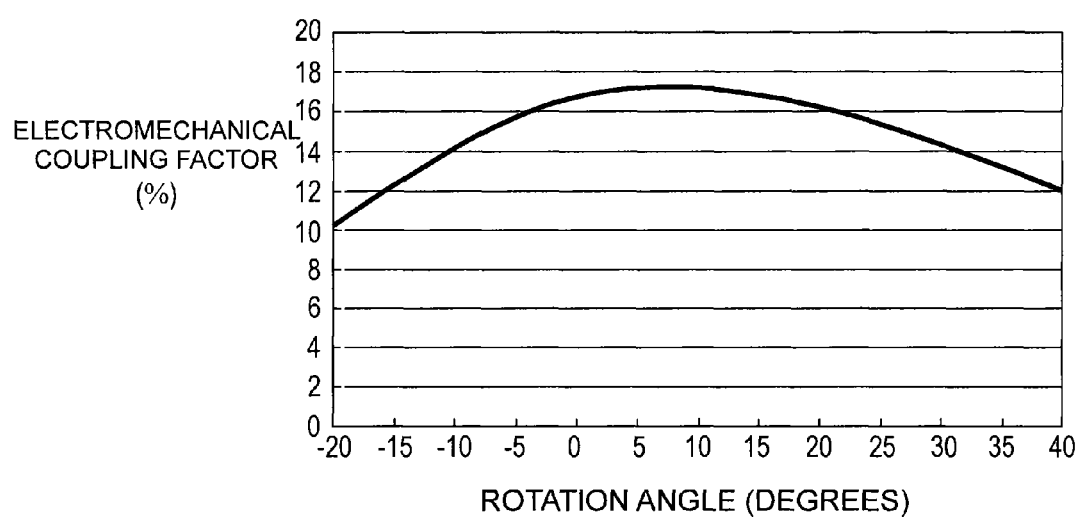
FIG. 3 is a characteristics diagram of a piezoelectric substrate according to the first embodiment of the present invention.

FIG. 3 shows the relationship between the rotation angle of the rotated Y-cut X-propagating lithium niobate and the electromechanical coupling factor of the resonator. In a range where the rotation angle is −10 to +30°, the electromechanical coupling factor of the resonator appears as equal to or greater than 14%. A greater electromechanical coupling factor of each resonator structuring the filter realizes an increase in the band of the filter and, therefore, use of such parameters is desirable.

In the present embodiment, the bulk wave emission frequency of first resonator 16 is 2180 MHz, which is higher than the passband of reception filter 13, i.e., 2110 to 2170 MHz. With the structure obtained in this manner, deterioration in the insertion loss of reception filter 13 can be prevented.

It is to be noted that the duty ratio of the comb-shaped electrode of first resonator 16 is desirably equal to or greater than 0.6 for adequately shifting the bulk wave emission frequency toward the higher range side. Conversely, the duty ratio being greater than 0.7 results in a reduction in Q-value as the resonance characteristic. Accordingly, the duty ratio thereof should desirably be 0.6 to 0.7.

(Second Embodiment)

Since a substantial structure of an acoustic wave duplexer according to a second embodiment is similar to that according to the first embodiment and, therefore, the description is not repeated herein and a description will be given of differences from the first embodiment in the following.

In a signal path that leads from antenna terminal 101 toward the transmission terminal, a signal at a reception frequency is attenuated by first resonator 16. Therefore, the insertion loss of reception filter 13 is little affected by the bulk wave emission at all the resonators that follow first resonator 16. Accordingly, the pitch of at least one of series-arm resonators 14 of second resonators 17 is set such that the bulk wave emission frequency of the at least one of series-arm resonators 14 structuring second resonators 17 becomes lower than the passband of reception filter 13. Thus, without incurring deterioration in the insertion loss, an increase in loss due to bulk wave conversion is achieved in addition to attenuation due to the original resonance characteristic. Therefore, an improvement in the attenuation amount in the duplex band of transmission filter 12, i.e., in the passband of reception filter 13, can be achieved. Furthermore, the signal that enters from the transmission terminal to pass through the reception terminal, i.e., the isolation characteristics, can also be improved.

In the present embodiment, the bulk wave emission frequency of the at least one resonator structuring second resonators 17 is 2096 MHz, which is lower than the passband 2110 to 2170 MHz of reception filter 13. With the structure obtained in this manner, in a path between the transmission terminal and antenna terminal 101, part of a signal in the reception frequency band passing through transmission filter 12 structured with second resonators 17 is converted into a bulk wave. This causes emission inside piezoelectric substrate 11, which contributes to an improvement in the attenuation amount of transmission filter 12 and in the isolation characteristics.

It is to be noted that the duty ratio of the comb-shaped electrode of second resonators 17 being smaller than 0.45 may invite an increase in the insertion loss due to an increase in the electrode resistance. Therefore, it is desirably equal to or greater than 0.45. Conversely, the duty ratio being greater than 0.55 hinders the achievement of the effect of an increase in the attenuation amount associated with the bulk wave conversion. Therefore, the duty ratio thereof should desirably be 0.45 to 0.55.

(Third Embodiment)

Figure 4:
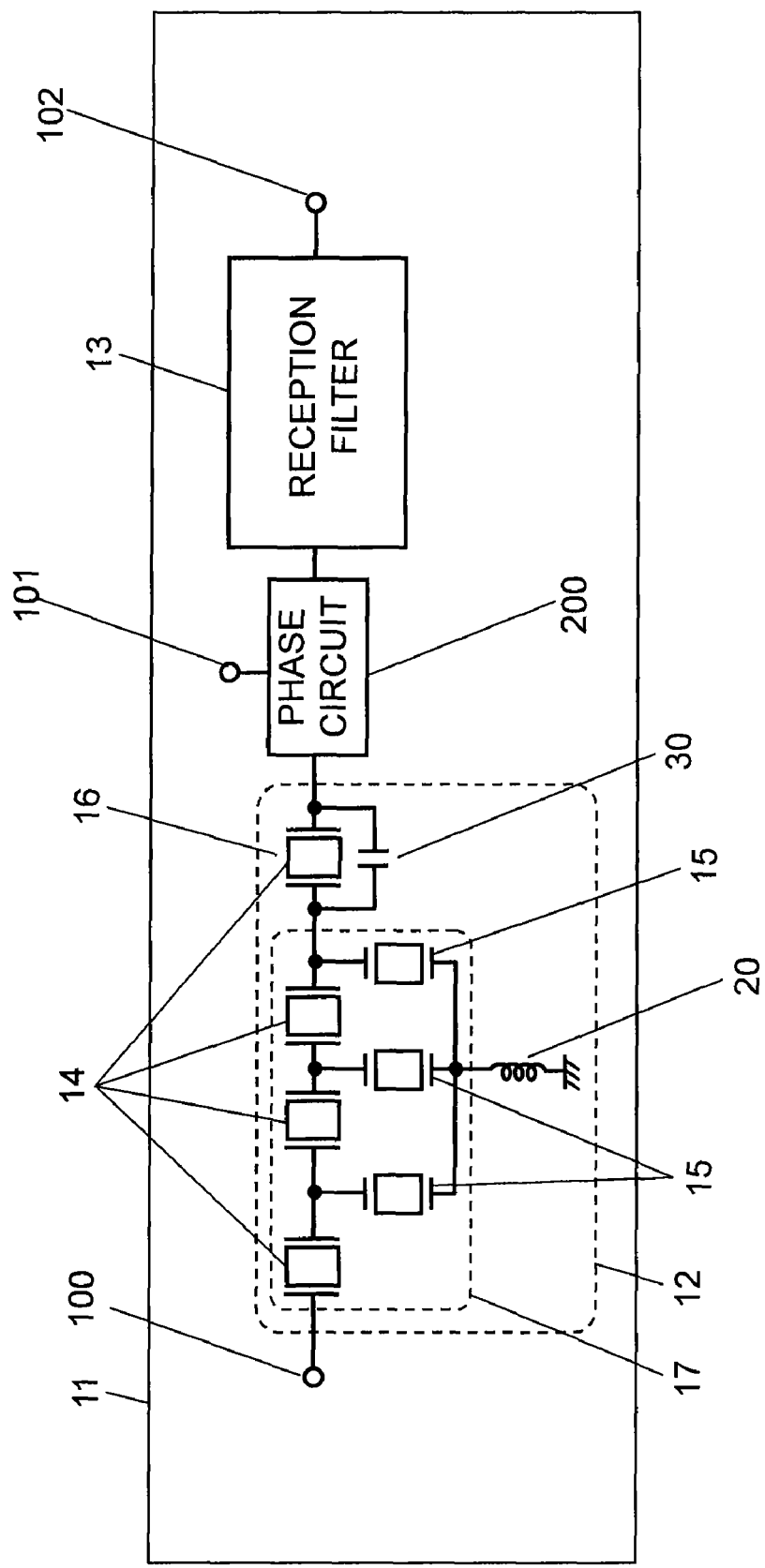
FIG. 4 is a configuration diagram of an acoustic wave duplexer according to a third embodiment of the present invention.
Figure 5:
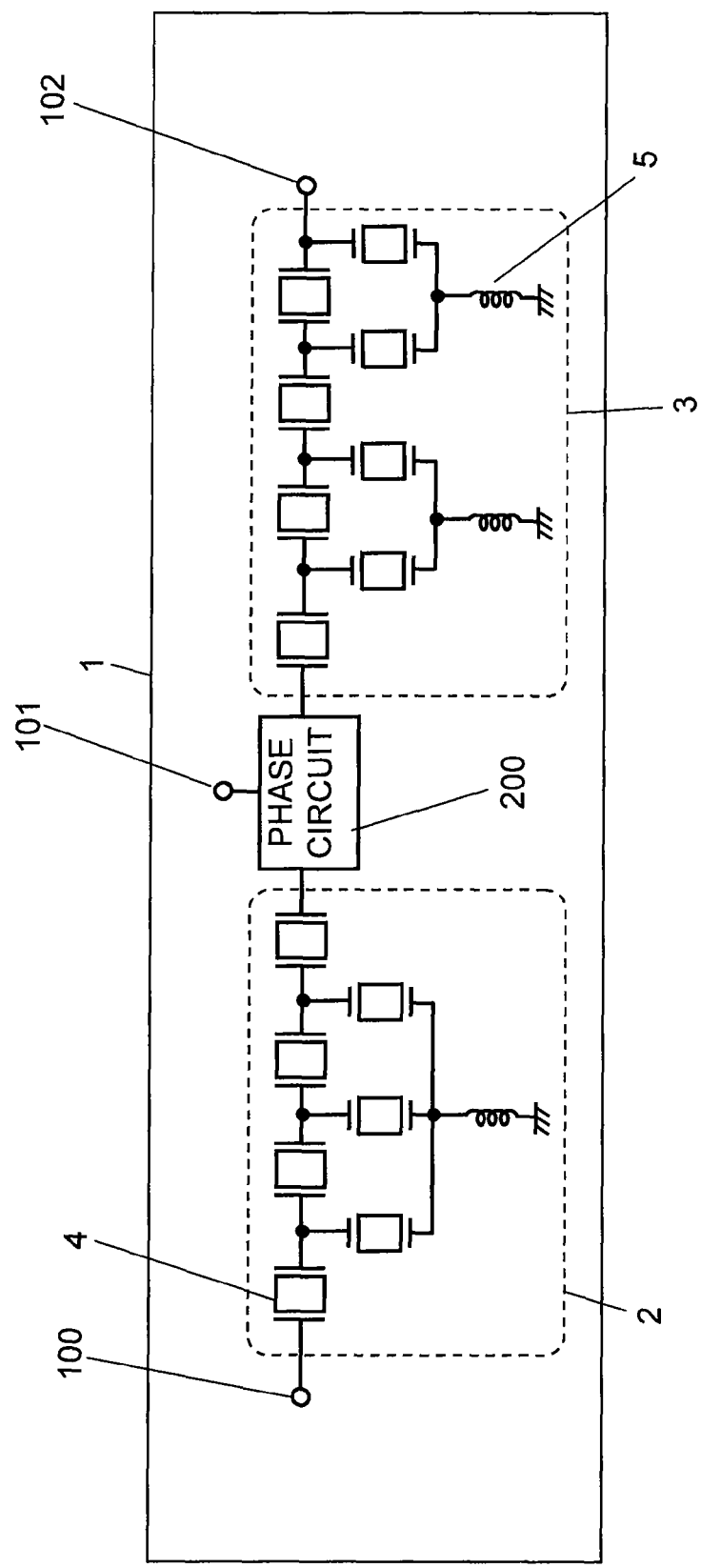
FIG. 5 is a configuration diagram of a conventional acoustic wave duplexer.

FIG. 4 is a configuration diagram of an acoustic wave duplexer according to a third embodiment of the present invention, in which capacitor 30 is connected in parallel to first resonator 16. In a case where the comb-shaped electrode pitch of first resonator 16 is narrowed for raising the bulk wave emission frequency of first resonator 16 to be higher than the reception frequency band, the anti-resonance frequency of first resonator 16 becomes simultaneously higher. This causes the anti-resonance frequency of first resonator 16 to be within the reception band, and an unnecessary notch occurs within the band of reception filter 13, resulting in deterioration of the insertion loss of reception filter 13. Accordingly, by taking measures to connect capacitor 30 in parallel to first resonator 16, the anti-resonance frequency of first resonator 16 is controlled to be lower than the reception band. Thus, the reception filter of desired characteristics can be implemented.

As to the foregoing embodiments, the descriptions have been given of the surface acoustic wave duplexer. On the other hand, a boundary acoustic wave device in which an insulating film (not shown) is formed on piezoelectric substrate 11 provided with a comb-shaped electrode, and an acoustic wave is propagated along the boundary between piezoelectric substrate 11 and the insulating film is also involved with the conversion into the bulk wave similarly to the surface acoustic wave device. Therefore, similar effects can be achieved also with the boundary acoustic wave duplexer.

As to the material of the electrodes, a material chiefly made of one selected from a group consisting of Al, Cu, Au, Pt, Ta, W, Ag, Ni, Mo, NiCr, Cr, and Ti, or an alloy thereof can provide the effect of the present invention. In particular, the effect of the present invention is obtained with metals such as Al, Ti whose density is low, whose acoustic velocity of an acoustic wave is close to the acoustic velocity of a slow transverse wave because of the acoustic velocity of the acoustic wave being fast.

INDUSTRIAL APPLICABILITY

An acoustic wave duplexer according to the present invention achieves an improvement both in an attenuation amount of a transmission filter in a duplex band and in isolation characteristics while preventing deterioration of the insertion loss of a reception filter. The present invention is useful for an acoustic wave duplexer chiefly used in mobile communication equipment.

REFERENCE MARKS IN THE DRAWINGS 11 piezoelectric substrate
12 transmission filter
13 reception filter
14 series-arm resonator
15 parallel-arm resonator
16 first resonator
17 second resonator
18 comb-shaped electrode
30 capacitor

The invention claimed is:

1. An acoustic wave duplexer, comprising:
a piezoelectric substrate; and
a first filter and a second filter provided on the piezoelectric substrate, wherein
a passband of the first filter is lower than a passband of the second filter,
the first filter is structured as a ladder type including series-arm resonators and parallel-arm resonators,
a resonator positioned nearest to an antenna terminal out of the series-arm resonators is designated as a first resonator,
a pitch of a comb-shaped electrode structuring the first resonator is set such that a bulk wave emission frequency of the first resonator becomes higher than the passband of the second filter.

2. The acoustic wave duplexer according to claim 1, wherein
the series-arm resonators and the parallel-arm resonators except for the first resonator are designated as second resonators, and
a pitch of a comb-shaped electrode of at least one resonator structuring the second resonators is set such that a bulk wave emission frequency of the at least one resonator structuring the second resonators becomes lower than the passband of the second filter.

3. The acoustic wave duplexer according to claim 2, wherein
a duty ratio of the comb-shaped electrode structuring each of the second resonators is 0.45 to 0.55.

4. The acoustic wave duplexer according to claim 2, wherein
a capacitor is connected in parallel to the first resonator.

5. The acoustic wave duplexer according to claim 2, wherein
the piezoelectric substrate is formed of a rotated Y-cut X-propagating lithium niobate.

6. The acoustic wave duplexer according to claim 5, wherein
the piezoelectric substrate is formed of a −10 to +30° rotated Y-cut X-propagating lithium niobate.

7. The acoustic wave duplexer according to claim 1, wherein
a capacitor is connected in parallel to the first resonator.

8. The acoustic wave duplexer according to claim 1, wherein
the piezoelectric substrate is formed of a rotated Y-cut X-propagating lithium niobate.

9. The acoustic wave duplexer according to claim 8, wherein
the piezoelectric substrate is formed of a −10 to +30° rotated Y-cut X-propagating lithium niobate.

10. The acoustic wave duplexer according to claim 1, wherein
a duty ratio of the comb-shaped electrode structuring the first resonator is 0.6 to 0.7.

* * * * *